(12) United States Patent  
Chaki

(10) Patent No.: US 12,525,554 B2  
(45) Date of Patent: Jan. 13, 2026

(54) SEMICONDUCTOR DEVICE WITH MMIC AND PADS REDUCING WIRE LENGTH

(71) Applicant: Mitsubishi Electric Corporation, Tokyo (JP)

(72) Inventor: Shin Chaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 688 days.

(21) Appl. No.: 17/814,159

(22) Filed: Jul. 21, 2022

(65) Prior Publication Data

US 2023/0343730 A1  Oct. 26, 2023

(30) Foreign Application Priority Data

Apr. 22, 2022 (JP) .................. 2022-070701

(51) Int. Cl.
*H01L 23/498* (2006.01)
*H01L 23/00* (2006.01)
*H01L 23/66* (2006.01)
*H10D 1/60* (2025.01)
(Continued)

(52) U.S. Cl.
CPC ............. *H01L 23/66* (2013.01); *H10D 1/692* (2025.01); *H10D 84/212* (2025.01); *H01L 2223/6611* (2013.01); *H01L 2223/6672* (2013.01); *H01L 2223/6683* (2013.01); *H01L 2223/6694* (2013.01); *H03B 2200/0028* (2013.01)

(58) Field of Classification Search
CPC ..... H01L 2223/6683; H01L 2223/6688; H01L 2223/6694; H01L 2924/1423; H01L 23/66; H01L 25/16; H01L 25/162; H01L 2924/19105; H01L 2224/49175; H01L 2223/6655; H01L 2924/19041; H03B 2200/0028; H10D 1/60; H01B 17/28; H10B 61/10

See application file for complete search history.

(56) References Cited

U.S. PATENT DOCUMENTS 6,424,223 B1 * 7/2002 Wang ...................... H01L 24/49
330/286
7,463,111 B2 * 12/2008 Inoue ...................... H01L 23/66
333/33
9,640,530 B2 * 5/2017 Sasaki ..................... H01L 24/49
(Continued)

FOREIGN PATENT DOCUMENTS

JP     S63-244761 A    10/1988
JP     2008-153477 A    7/2008
(Continued)

*Primary Examiner* — Wael M Fahmy
*Assistant Examiner* — Aneesa Riaz Baig
(74) *Attorney, Agent, or Firm* — Studebaker Brackett PLLC

(57) ABSTRACT

A semiconductor device includes: an MMIC having a DC pad; a bias substrate; a plurality of MIM capacitors mounted on the bias substrate; a plurality of pads provided on the bias substrate and respectively connected to overlying electrodes of the MIM capacitors; and a wire connecting the DC pad to any one of the plurality of pads, wherein the plurality of pads are arranged between the DC pad and the plurality of MIM capacitors in a planar view, and extend parallel to a row of the plurality of MIM capacitors laterally arranged side by side.

20 Claims, 9 Drawing Sheets

(51) Int. Cl.
*H10D 1/68* (2025.01)
*H10D 84/00* (2025.01)

(56) References Cited

U.S. PATENT DOCUMENTS

| | | | |
|---|---|---|---|
| 11,929,317 B2* | 3/2024 | Patel | H10D 84/811 |
| 2002/0097094 A1* | 7/2002 | Wang | H01L 24/49 |
| | | | 330/286 |
| 2013/0120069 A1* | 5/2013 | Takagi | H03F 3/602 |
| | | | 330/295 |
| 2016/0247798 A1* | 8/2016 | Sasaki | H01L 23/66 |
| 2017/0012587 A1* | 1/2017 | Zhang | H03F 1/3205 |
| 2018/0090456 A1* | 3/2018 | Kato | H01L 24/06 |
| 2020/0204119 A1* | 6/2020 | Roberts | H03F 1/0288 |
| 2020/0204121 A1* | 6/2020 | Zhu | H01L 21/4825 |
| 2020/0304066 A1* | 9/2020 | Itasaka | H03B 5/20 |
| 2021/0006251 A1* | 1/2021 | Itasaka | H03L 1/022 |
| 2021/0225784 A1* | 7/2021 | Shilimkar | H01L 24/48 |
| 2022/0263497 A1* | 8/2022 | Watanabe | H03H 7/1758 |
| 2023/0207500 A1* | 6/2023 | Koyama | H03B 7/08 |
| | | | 257/728 |

FOREIGN PATENT DOCUMENTS

| | | | |
|---|---|---|---|
| JP | 2015-142112 A | 8/2015 | |
| JP | 2016-158167 A | 9/2016 | |
| JP | 2019-145675 A | 8/2019 | |
| JP | 2020-156000 A | 9/2020 | |

* cited by examiner

SEMICONDUCTOR DEVICE WITH MMIC AND PADS REDUCING WIRE LENGTH

BACKGROUND OF THE INVENTION

Field

The present disclosure relates to a semiconductor device.

Background

A monolithic microwave integrated circuit (MMIC) in a microwave band or a milliwave band has been used (see, e.g., JP S63-244761 A). In a semiconductor device in which the MMIC is mounted on a package, an MIM capacitor is arranged in the vicinity of a DC pad in the MMIC, and both the DC pad and the MIM capacitor are connected to each other by a wire. The MIM capacitor short-circuits an unnecessary low-frequency signal, to prevent oscillation of an amplifier MMIC circuit and leakage of an RF signal toward a bias circuit.

SUMMARY

The size of an MIM capacitor is approximately three times, for example, as large as the size of a DC pad. Accordingly, if a plurality of, particularly three or more DC pads are arranged in close proximity to one another, when three or more MIM capacitors to be respectively connected to the DC pads by wires are laterally arranged side by side, the wires are oblique. Therefore, the length of each of the wires increases, whereby an inductance value increases. A low-frequency signal cannot be short-circuited because it is reflected on the circuit side by an inductance component of the wire, which may cause oscillation.

If the number of wires is increased, a total inductance value can be reduced by parallelizing their respective inductances. However, the upper limit of the number of wires is determined due to a constraint on the size of the MIM capacitors. Accordingly, there has been a constraint on a reduction in the inductances.

The present disclosure has been made to solve the above-described problem, and is directed to obtaining a semiconductor device capable of reducing an inductance value of a wire.

A semiconductor device according to the present disclosure includes: an MMIC having a DC pad; a bias substrate; a plurality of MIM capacitors mounted on the bias substrate; a plurality of pads provided on the bias substrate and respectively connected to overlying electrodes of the MIM capacitors; and a wire connecting the DC pad to any one of the plurality of pads, wherein the plurality of pads are arranged between the DC pad and the plurality of MIM capacitors in a planar view, and extend parallel to a row of the plurality of MIM capacitors laterally arranged side by side.

In the present disclosure, the plurality of pads are respectively arranged between the DC pads and the MIM capacitors in a planar view, and extend parallel to the row of the MIM capacitors laterally arranged side by side. As a result, the degree of freedom of respective bonding positions of the wires relative to the pads increase. Accordingly, the wires can be shortened. The number of the wires does not depend on the size of the MIM capacitors. Therefore, an inductance value of each of the wires can be reduced.

Other and further objects, features and advantages of the invention will appear more fully from the following description.

DESCRIPTION OF EMBODIMENTS

A semiconductor device according to the embodiments of the present disclosure will be described with reference to the drawings. The same components will be denoted by the same symbols, and the repeated description thereof may be omitted.

First Embodiment

Figure 1:
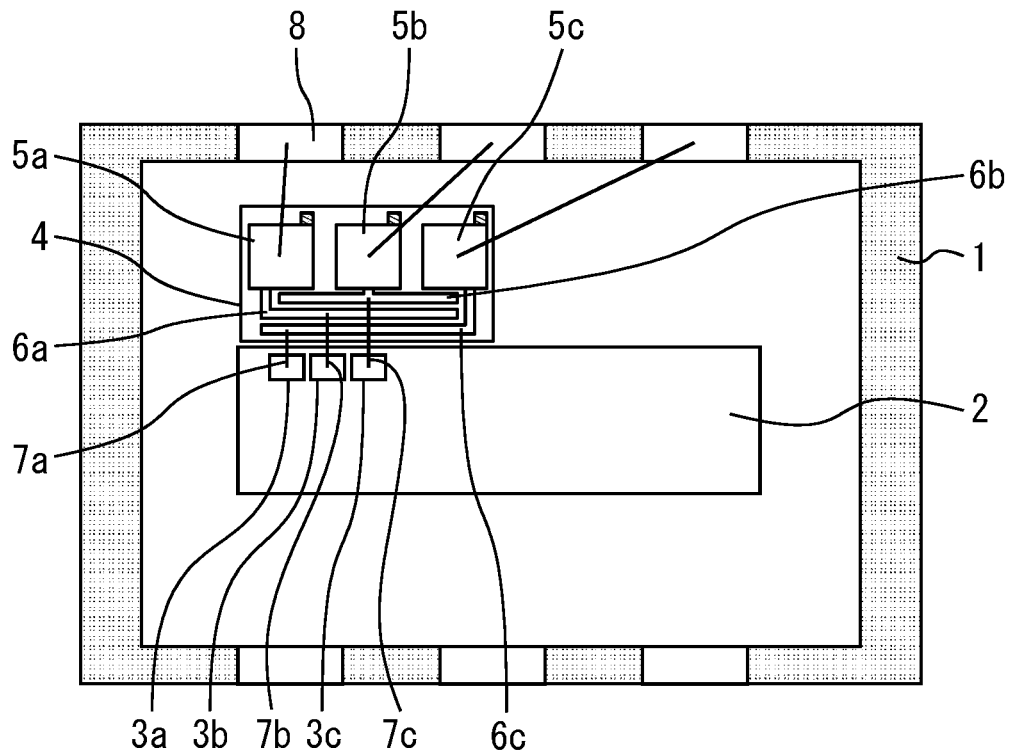
FIG. 1 is a plan view illustrating a semiconductor device according to a first embodiment.

FIG. 1 is a plan view illustrating a semiconductor device according to a first embodiment. An MMIC 2 is provided in a package 1. The MMIC 2 is an amplifier MMIC circuit in a microwave band or a milliwave band, and has three DC pads 3a to 3c arranged in a row on its upper surface. A bias substrate 4 is provided adjacent to the MMIC 2 in the package 1. A material for the bias substrate 4 is generally a substrate material used for a high-frequency circuit, and examples of the substrate material include GaAs, GaN, SiC, and ceramic.

Three MIM capacitors 5a to 5c are mounted on the bias substrate 4. The MIM capacitors 5a to 5c are arranged in this order in a row in a planar view. The three pads 6a to 6c are provided on the bias substrate 4. The pads 6a to 6c are respectively connected to overlying electrodes of the MIM capacitors 5a to 5c by air bridges (not illustrated) or the like. The pads 6a to 6c are respectively arranged between the DC pads 3a to 3c and the MIM capacitors 5a to 5c in a planar view, and extend parallel to the row of the MIM capacitors 5a to 5c laterally arranged side by side.

Wires 7a to 7c respectively connect the DC pads 3a to 3c to the pads 6a to 6c. However, the wires need not be respectively connected to all the pads, but at least one of the wires may connect any of the DC pads 3a to 3c to any of the pads 6a to 6c.

The overlying electrodes of the MIM capacitors 5a to 5c are respectively connected to lead connection portions 8 in the package 1 by wires. However, if there is a concern such as a damage when each of the wires is directly bonded to the overlying electrode of the MIM capacitor, another pad connected to the overlying electrode is provided on the opposite side to the MMIC 2 with respect to the MIM capacitor, and the pad and the lead connection portion 8 may be connected to each other by a wire.

Figure 2:
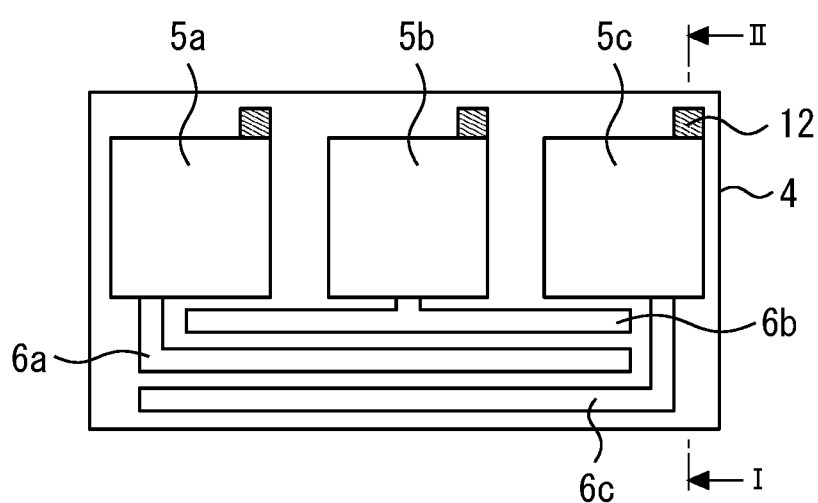
FIG. 2 is a plan view illustrating the bias substrate according to the first embodiment.

FIG. 2 is a plan view illustrating the bias substrate according to the first embodiment. The pads 6a to 6c respectively extend at positions opposing the three MIM capacitors 5a to 5c. Specifically, the pad 6a extends toward the MMIC 2 from the overlying electrode of the MIM capacitor 5a, and then extends to a position opposing at least a part of the MIM capacitor 5c from the position opposing the MIM capacitor 5a. The pad 6c extends toward the MMIC 2 from the overlying electrode of the MIM capacitor 5c, and then extends to a position opposing at least a part of the MIM capacitor 5a from the position opposing the MIM capacitor 5c. The pad 6b extends toward the MMIC 2 from the overlying electrode of the MIM capacitor 5b, and then extends to a position opposing at least a part of the MIM capacitor 5a and a position opposing at least a part of the MIM capacitor 5c after branching from the position opposing the MIM capacitor 5b. Therefore, the pads 6a to 6c respectively have lengths corresponding to the lengths of the three MIM capacitors 5a to 5c.

Figure 3:
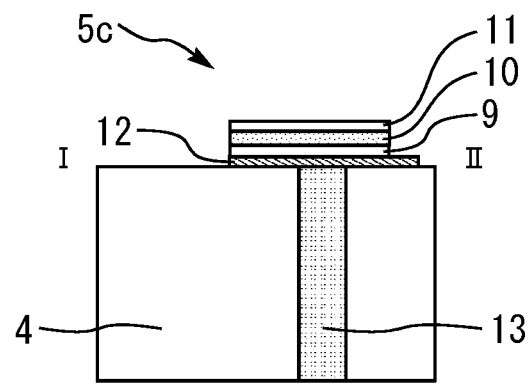
FIG. 3 is a cross-sectional view taken along a line I-II illustrated in FIG. 2.

FIG. 3 is a cross-sectional view taken along a line I-II illustrated in FIG. 2. The MIM capacitor 5c has an underlying electrode 9, an insulating film 10, and an overlying electrode 11 laminated therein in this order from below. A capacitance value of the MIM capacitor 5c is determined depending on the specific dielectric constant and the thickness of the insulating film 10 and the area of the MIM capacitor 5c. A ground pad 12 is provided on the bias substrate 4, and is connected to the underlying electrode 9 of the MIM capacitor 5c. The ground pad 12 is pulled out toward the opposite side to the MMIC 2 with respect to the MIM capacitor 5c in a planar view. A plurality of via holes 13 penetrate the bias substrate 4, and are connected to the underlying electrode 9 of the MIM capacitor 5c. The underlying electrode 9 of the MIM capacitor 5c is connected to a GND via the via holes 13. The same applies to respective structures of the MIM capacitors 5a and 5b.

However, when each of the MIM capacitors 5a to 5c is previously connected to the GND via the via holes 13, the MIM capacitors 5a to 5c are difficult to connect in series. Therefore, if the MIM capacitors 5a to 5c need to be connected in series, the via holes 13 need not necessarily be formed. If there are no via holes 13, the ground pad 12 connected to each of the underlying electrodes 9 of the MIM capacitors 5a to 5c is connected to the GND by a wire. The ground pad 12 can also be omitted to make connection to the GND using only the underlying electrode 9 having the same shape as that of the ground pad 12.

The ground pad 12 pulled out has a shape close to a square shape in FIG. 2. Not only this, but the ground pad 12 may have a rectangular shape along the side of each of the MIM capacitors 5a to 5c or the area of the ground pad 12 may be increased if the ground pad 12 is desired to be connected to the GND by a plurality of wires.

Figure 4:
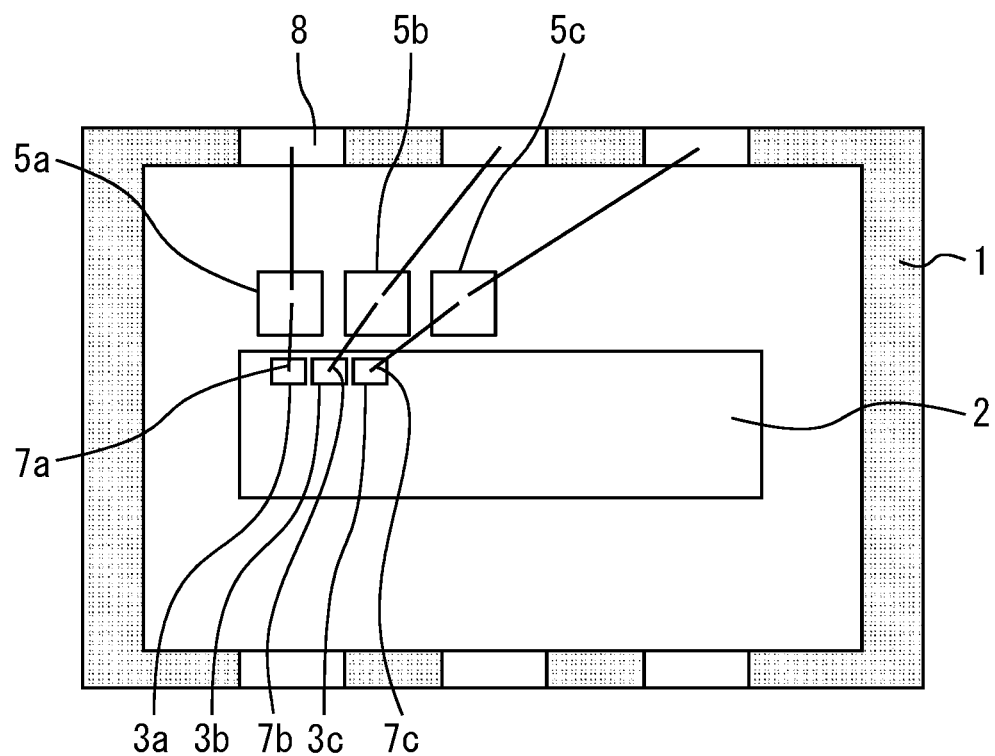
FIG. 4 is a diagram illustrating a semiconductor device according to a comparative example 1.

Then, an effect of the present embodiment will be described while comparing those of comparative examples 1 and 2. In the comparative examples 1 and 2, MIM capacitors 5a to 5c and DC pads 3a to 3c are respectively directly connected to each other by wires without using a bias substrate 4 and pads 6a to 6c. FIG. 4 is a diagram illustrating a semiconductor device according to the comparative example 1. The MIM capacitors 5a to 5c are arranged side by side in a row. A wire 7c that connects the DC pad 3c and the MIM capacitor 5c at a right end is the longest.

Figure 5:
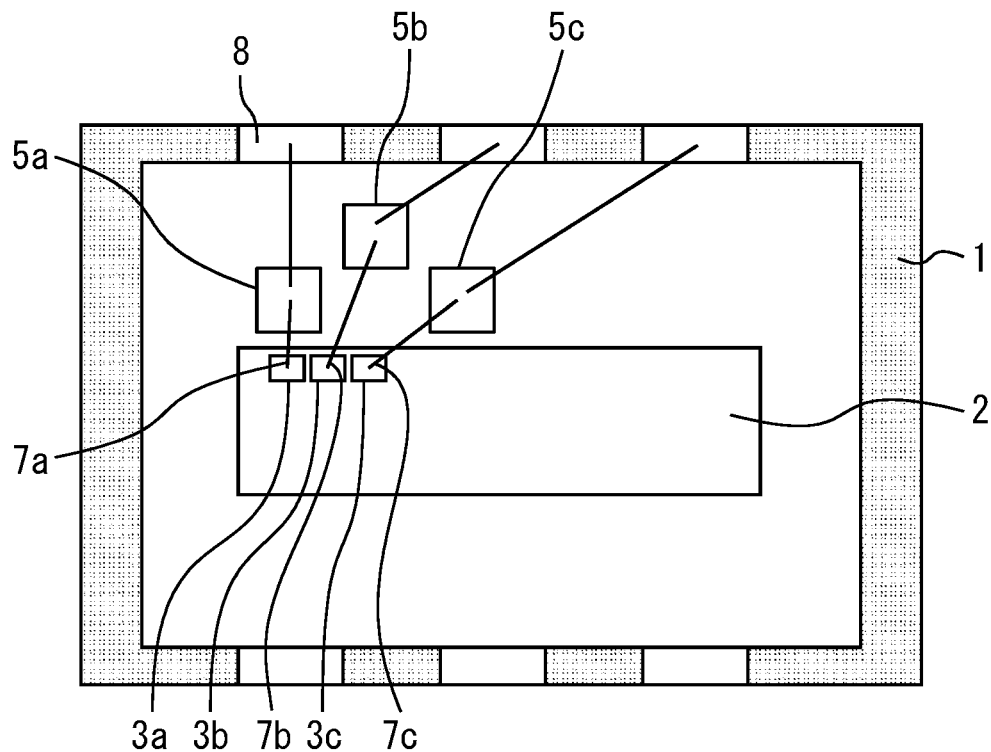
FIG. 5 is a diagram illustrating a semiconductor device according to a comparative example 2.

FIG. 5 is a diagram illustrating a semiconductor device according to the comparative example 2. Only the MIM capacitor 5b at the center is arranged far from an MMIC 2, and the MIM capacitors 5a and 5c on the left and right sides are arranged side by side close to the MMIC 2. The length of a wire 7b that connects the DC pad 3b and the MIM capacitor 5b at the center is two or more times those of wires 7a and 7c on the left and right sides.

In the comparative examples 1 and 2, the respective lengths of some of the wires are thus large. Accordingly, a low-frequency signal cannot be effectively short-circuited, resulting in an increased risk of oscillation. On the other hand, in the present embodiment, the plurality of pads 6a to 6c are respectively arranged between the DC pads 3a to 3c and the MIM capacitors 5a to 5c in a planar view, and extend parallel to the row of the MIM capacitors 5a to 5c laterally arranged side by side. As a result, the degree of freedom of respective bonding positions of the wires 7a to 7c relative to the pads 6a to 6c increase. Accordingly, the wires 7a to 7c can be shortened. The number of the wires 7a to 7c does not depend on the size of the MIM capacitors 5a to 5c. Therefore, an inductance value of each of the wires 7a to 7c can be reduced.

Letting Lw be an inductance of each of the wires 7a to 7c and letting R be a resistance, a cutoff frequency fc of the wires 7a to 7c is fc=R/(2×π×Lw). When Lw increases, fc decreases. Thus, a low-frequency band through which the low-frequency signal passes narrows. Therefore, if Lw increases when an attempt to short-circuit the low-frequency signal is made, the low-frequency signal can be short-circuited in a region close to a DC. However, the low-frequency signal is reflected toward the MMIC 2 in a low-frequency region spaced apart from the DC, resulting in an increased risk of oscillation. Since the inductance functions as a low-pass filter, a frequency of fc or more is reflected without being passed.

Figure 6:
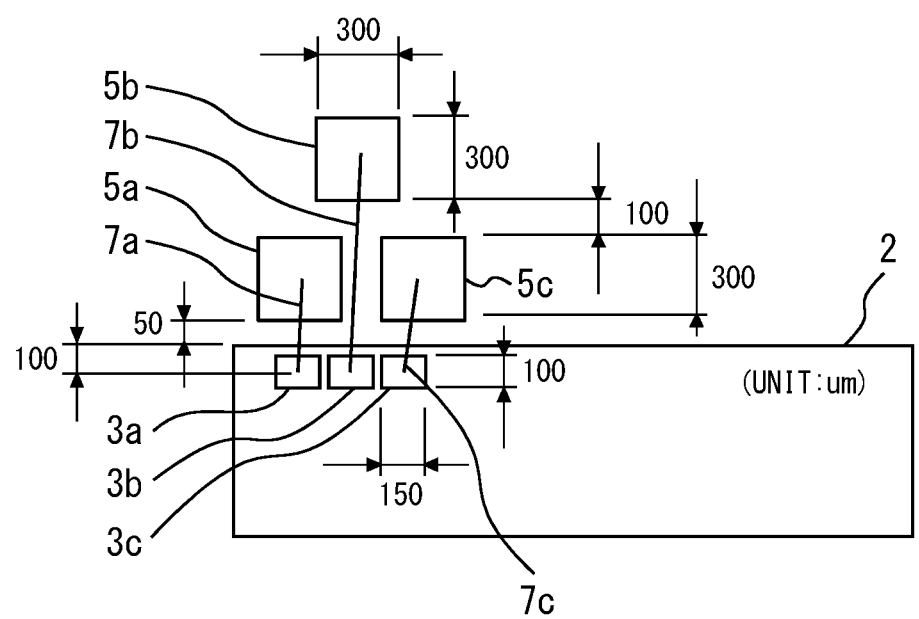
FIG. 6 is a plan view illustrating an example of a wire length of the semiconductor device according to the comparative example 2.

FIG. 6 is a plan view illustrating an example of a wire length of the semiconductor device according to the comparative example 2. The three DC pads 3a to 3c in the MMIC 2 and the three MIM capacitors 5a to 5c are respectively directly connected to each other by wires. The size of the DC pads 3a to 3c is 150 μm×100 μm. The size of the MIM capacitors 5a to 5c is 300 μm×300 μm. A size from the DC pads 3a to 3c to an end of the MMIC 2 is 50 μm. A spacing between the MMIC 2 and the MIM capacitors 5a and 5c is 50 μm. The wires 7a to 7c are respectively installed between the centers of the DC pads 3a to 3c and the centers of the MIM capacitors 5a to 5c. In this case, the length of the wires 7a and 7c that respectively connect the DC pads 3a and 3c and the MIM capacitors 5a and 5c on the left side and the right side is 300 µm when the length of a loop shape of each of the wires is ignored. When a distance among the MIM capacitors 5a to 5c is 100 µm, the length of the wire 7b that connects the DC pad 3b and the MIM capacitor 5b at the center is 700 µm.

Figure 7:
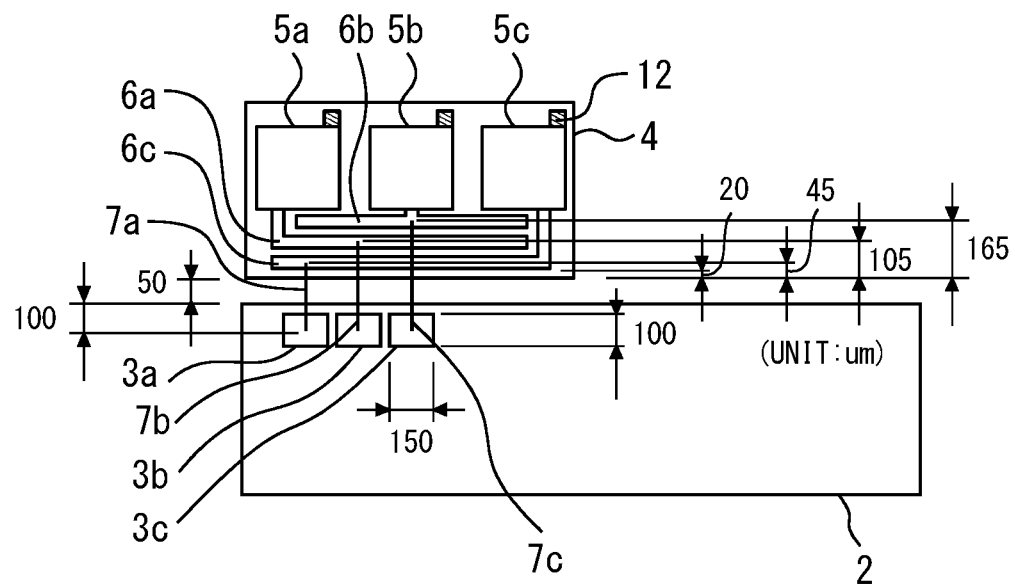
FIG. 7 is a plan view illustrating an example of a wire length of the semiconductor device according to the first embodiment.

FIG. 7 is a plan view illustrating an example of a wire length of the semiconductor device according to the first embodiment. The width of the pads 6a to 6c is 50 µm. A spacing among the pads 6a to 6c is 10 µm. The length of the wire 7a of the DC pad 3a on the left side is 195 µm. The length of the wire 7b of the DC pad 3b at the center is 255 µm. The length of the wire 7c of the DC pad 3c on the right side is 315 µm. Therefore, the length of the wires 7a to 7c in the first embodiment is one-half or less the length 700 µm of the wire 7b at the center in the comparative example 2.

Table 1 illustrates a relationship between a wire length and an inductance value L and a cutoff frequency fc corresponding to the wire length. A relationship between the wire length and the inductance value was estimated using 1 nH/mm estimated by electromagnetic field analysis. A wire diameter was set to 30 µm in calculation.

TABLE 1

| wire length (um) | L (nH) | fc (MHz) |
|---|---|---|
| 195 | 0.195 | 81.7 |
| 215 | 0.215 | 74.1 |
| 255 | 0.255 | 62.4 |
| 275 | 0.275 | 57.9 |
| 300 | 0.300 | 53.1 |
| 315 | 0.315 | 50.6 |
| 700 | 0.700 | 22.7 |

When the wire length is 700 µm in the comparative example 2, the inductance value L is 0.70 nH, and the cutoff frequency fc is 22.7 MHz. Therefore, a frequency of 22.7 MHz or more is reflected. On the other hand, when the wire length is 315 µm in the first embodiment, the inductance value L is 0.315 nH, and the cutoff frequency fc is 50.6 MHz. Therefore, a low frequency signal can be short-circuited up to a higher frequency of 50.6 MHz, resulting in a greatly reduced risk of oscillation. Although the length in a height direction of a wire was ignored in the current estimation, a wire length is approximately 1.5 times the above-described length if the height direction is considered. Therefore, the cutoff frequency fc illustrated in Table 1 is actually shifted toward the lower side.

In the comparative examples 1 and 2, the number of wires is limited depending on the area of the MIM capacitor. Accordingly, the maximum number of wires decreases. For example, in the MIM capacitor having a size of 300 µm×300 µm, the upper limit of the number of wires may be three even if there is no constraint on a peripheral circuit. On the other hand, in the present embodiment, the length in a longitudinal direction of the pads 6a to 6c respectively connected to the overlying electrodes of the MIM capacitors 5a to 5c is approximately three times the length of respective one sides of the MIM capacitors 5a to 5c. Therefore, the number of wires is increased so that an inductance value of each of the wires can be reduced.

Figure 8:
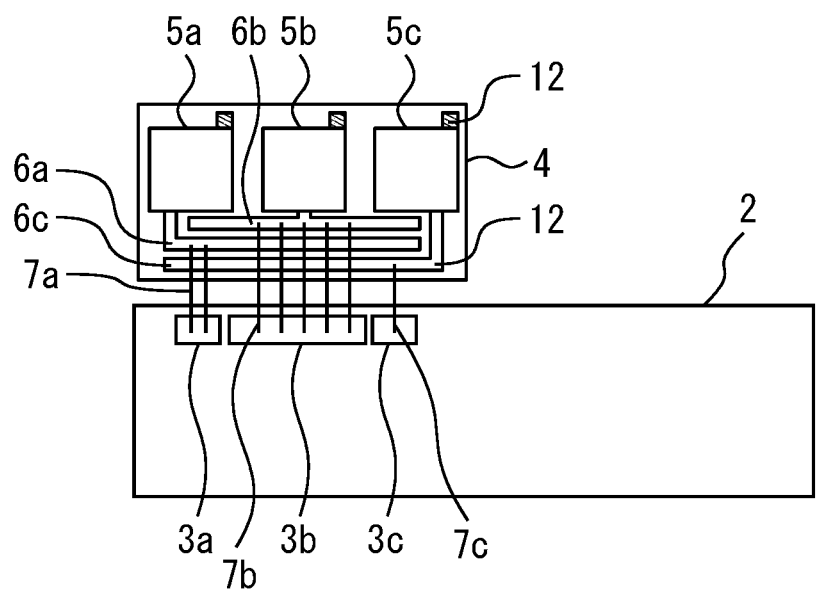
FIG. 8 is a plan view illustrating a modification of the bias substrate according to the first embodiment.

FIG. 8 is a plan view illustrating a modification of the bias substrate according to the first embodiment. When the size of the DC pad 3b in the MMIC 2 is increased, the number of wires can be increased. If five wires are installed, for example, the inductance value of each of the wires can be reduced to one-fifth that when the number of wires is one.

The number of wires to be connected to the pad 6b at the center is set to five, and the number of wires to be connected to the pad 6c on the left side is set to two.

An optimum capacitance value of the MIM capacitor changes depending on a use frequency band of an amplifier MMIC, a bias condition, a circuit configuration of the MMIC, a circuit configuration around the MMIC, and the like. Therefore, in order to select and load MIM capacitors respectively having different capacitance values depending on a condition, a required number of all types of MIM capacitors have been conventionally prepared before assembling is started. However, chip capacitors hardly change in appearance even if they respectively have different capacitances, and are difficult to determine. Accordingly, when the number of types of MIM capacitors is large, a work mistake may be induced. The MIM capacitors cannot be made common, the number of types of MIM capacitors increases, and the number of MIM capacitors to be used per type decreases, which may impose a constraint on a reduction in costs. Even when the MIM capacitors having the same capacitance value can be used, if the MIM capacitor is provided for each of the DC pads in the MMIC, the number of components to be die-bonded increases. For example, in the comparative examples 1 and 2, each of the three MIM capacitors 5a to 5c is die-bonded to the package 1. A time period required for the die bonding increases, whereby a throughput decreases. On the other hand, in the present embodiment, the one bias substrate 4 provided with the three MIM capacitors 5a to 5c is die-bonded to the package 1. Therefore, the number of components to be die-bonded is smaller in the present embodiment, whereby a throughput is improved.

Although the pads 6a to 6c are arranged in three rows, a pad width is desirably a minimum dimension with which wires can be installed. A pad spacing is also desirably a minimum spacing with which wires can be installed in a process. When the pad width and the pad spacing are minimized, the length of the wires 7a to 7c that respectively connect the DC pads 3a to 3c and the pads 6a to 6c to each other can be reduced. The pad width may be determined depending on a required current capacitance.

If the capacitance value of the MIM capacitor, i.e., the area of the MIM capacitor is desired to be increased, for example, and if there is a constraint on the size of the bias substrate 4, the number of MIM capacitors may be two or less. In the present embodiment, the respective capacitance values of the three MIM capacitors are made the same. However, if a larger number of MIM capacitors are used, the capacitance value may be changed for three of the MIM capacitors.

Second Embodiment

Figure 9:
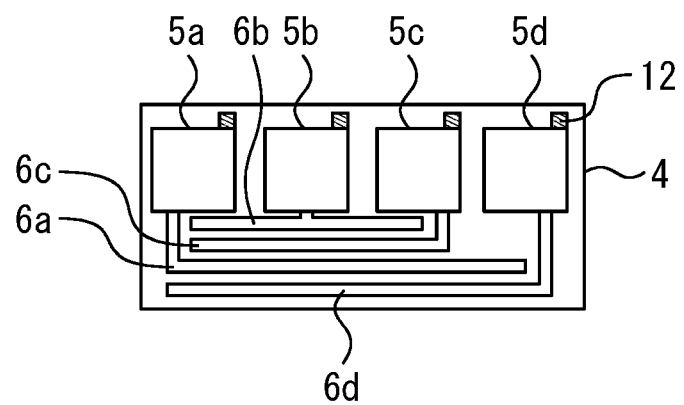
FIG. 9 is a plan view illustrating a bias substrate according to a second embodiment.

FIG. 9 is a plan view illustrating a bias substrate according to a second embodiment. An MIM capacitor 5d is provided on the right side of a row of MIM capacitors 5a to 5c. The MIM capacitors 5a to 5d are arranged in one row. A pad 6d is further provided on a bias substrate 4. The pad 6d is connected to an overlying electrode of the MIM capacitor 5d, and wraps around between DC pads 3a to 3c and pads 6a to 6c after extending toward an MMIC 2 in a planar view. The pad 6d extends parallel to the row of the MIM capacitors 5a to 5d laterally arranged side by side, and extends at a position opposing the MIM capacitors 5a to 5d. Therefore, the pad 6d has a length corresponding to the respective lengths of the four MIM capacitors 5a to 5d. Other components are similar to those in the first embodiment.

Figure 10:
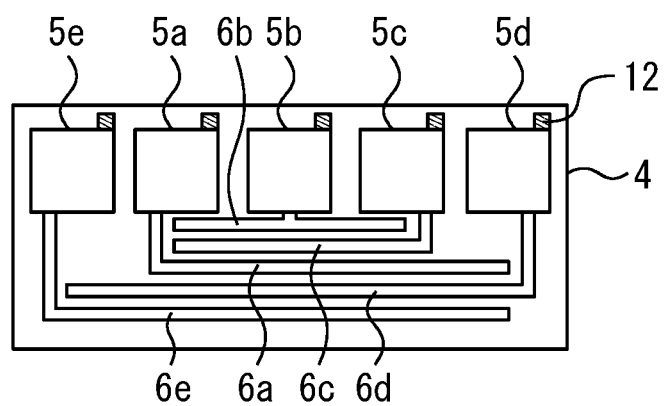
FIG. 10 is a plan view illustrating a modification of the bias substrate according to the second embodiment.

FIG. 10 is a plan view illustrating a modification of the bias substrate according to the second embodiment. A MIM capacitor 5e is further provided on the left side of a row of the MIM capacitors 5a to 5d. The MIM capacitors 5a to 5e are arranged in one row. A pad 6e is further provided on a bias substrate 4. The pad 6e is connected to an overlying electrode of the MIM capacitor 5e, and wraps around between DC pads 3a to 3c and pads 6a to 6d after extending toward an MMIC 2 in a planar view. The pad 6e extends parallel to the row of the MIM capacitors 5a to 5e laterally arranged side by side, and extends at a position opposing the MIM capacitors 5a to 5e. Therefore, the pad 6e has a length corresponding to the length of the five MIM capacitors 5a to 5e.

One MIM capacitor is added on the right side of the row of the MIM capacitors in the first embodiment in FIG. 9, and one MIM capacitors are respectively added on both sides of the row in FIG. 10. Therefore, the bias substrate 4 is lengthened in a lateral direction. However, the pads 6d and 6e respectively connected to the added MIM capacitors also extend parallel to the row of the MIM capacitors 5a to 5c laterally arranged side by side. Accordingly, even if four or five DC pads in the MMIC 2 are arranged in close proximity to one another, each of wires can be shortened, like in the first embodiment.

A wire to be connected to the pad 6d closest to the MIM capacitors 5a to 5c is long. If an inductance value of the wire cannot be allowed, the number of wires may be increased by increasing the size of the DC pad to be connected to the pad 6d, like in FIG. 8.

Third Embodiment

Figure 11:
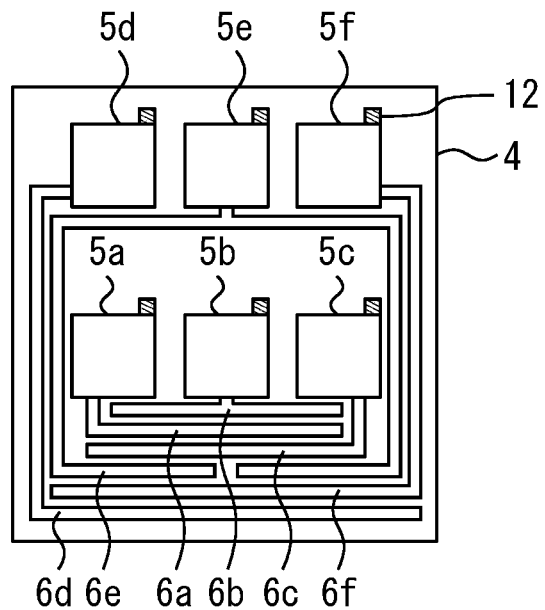
FIG. 11 is a plan view illustrating a bias substrate according to a third embodiment.

FIG. 11 is a plan view illustrating a bias substrate according to a third embodiment. Six MIM capacitors 5a to 5f are mounted side by side in two rows on a bias substrate 4. The MIM capacitors 5d to 5f are arranged farther from an MMIC 2 than the MIM capacitors 5a to 5c, and are arranged parallel to the row of the MIM capacitors 5a to 5c. Pads 6d to 6f are respectively connected to overlying electrodes of the MIM capacitor 5d to 5f, and respectively wrap around between DC pads 3a to 3c and pads 6a to 6c after extending toward the MMIC 2 from both the sides in a planar view. Each of the pads 6d to 6f extends parallel to the row of the MIM capacitors 5a to 5c laterally arranged side by side, and extends at a position opposing the MIM capacitors 5a to 5c.

If a longitudinal dimension of the MMIC 2 is short and if pads are arranged in a large number and in close proximity to one another, a structure in the present embodiment is effective. Two bias substrates 4 in the first embodiment can also be used while being laterally arranged side by side depending on the size of the MMIC 2 and a positional relationship among the pads.

Fourth Embodiment

Figure 12:
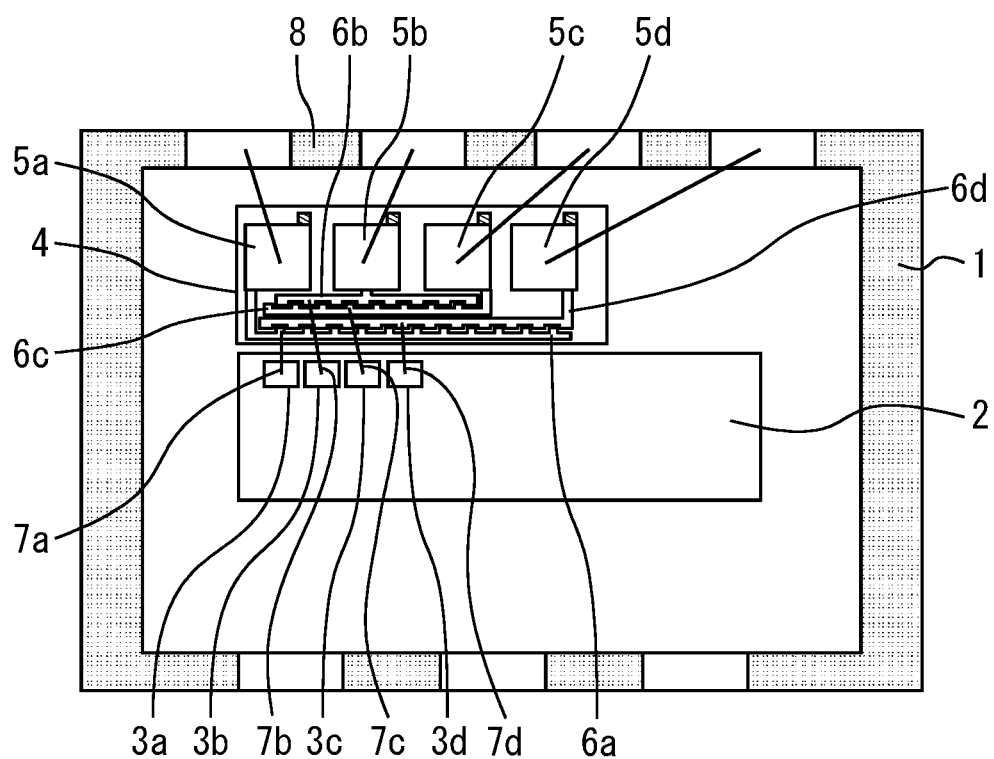
FIG. 12 is a plan view illustrating a semiconductor device according to a fourth embodiment.
Figure 13:
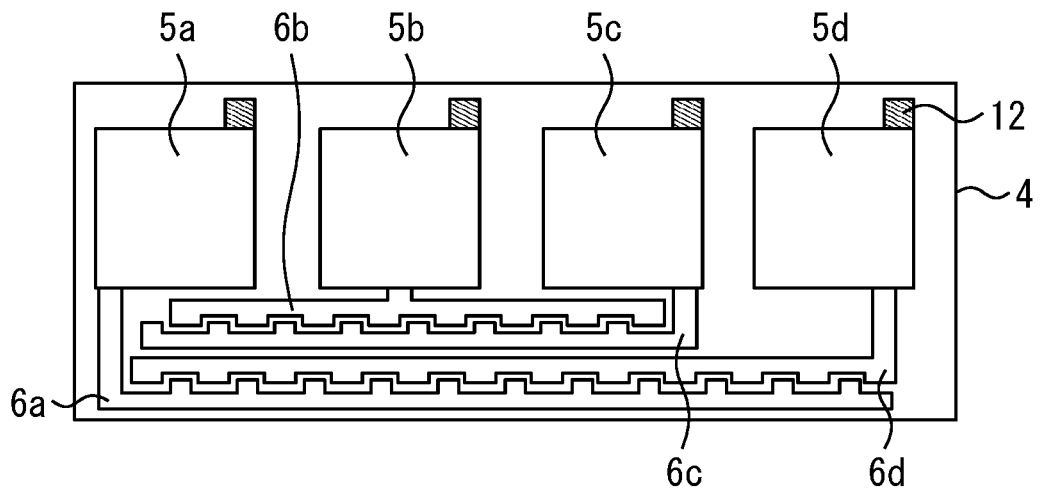
FIG. 13 is a plan view illustrating a bias substrate according to the fourth embodiment.

FIG. 12 is a plan view illustrating a semiconductor device according to a fourth embodiment. FIG. 13 is a plan view illustrating a bias substrate according to the fourth embodiment. A planar shape of pads 6a to 6d is an uneven shape. A projection of one of the pads 6b and 6c adjacent to each other is arranged to be fitted into a recess of the other pad. A projection of one of the pads 6a and 6d adjacent to each other is arranged to be fitted into a recess of the other pad.

As a result, a distance between an end on the MMIC 2 side of the bias substrate 4 and each of MIM capacitors 5a to 5d can be shortened. Therefore, a wire length is shortened, thereby making it possible to effectively short-circuit a low-frequency signal.

Figure 14:
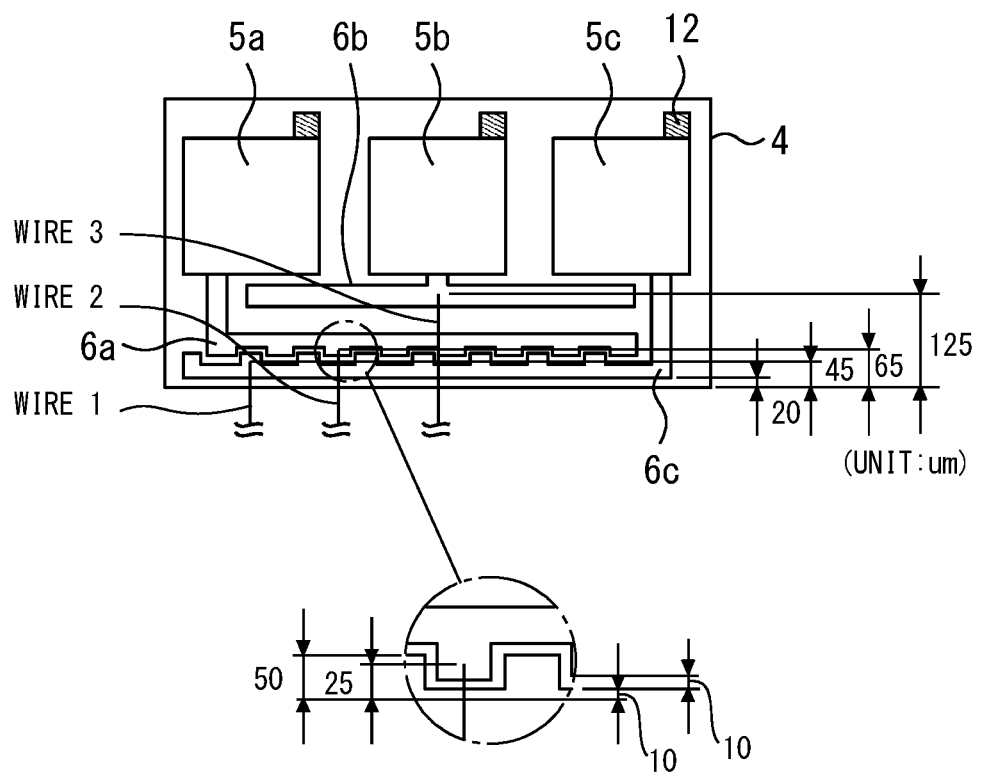
FIG. 14 is a plan view illustrating dimensions of the bias substrate according to the fourth embodiment.

FIG. 14 is a plan view illustrating dimensions of the bias substrate according to the fourth embodiment. The length of a wire to be connected to the pad 6a on the left side is 195 μm. The length of a wire to be connected to the pad 6b at the center is 215 μm. The length of the wire to be connected to the pad 6c on the right side is 275 μm, and is smaller by 40 μm than the length 315 μm in FIG. 7. According to Table 1, if a wire length is 315 μm, an inductance value L is 0.315 nH, and a cutoff frequency fc is 50.6 MHz. On the other hand, if a wire length is 275 μm, an inductance value L is 0.275 nH, and a cutoff frequency fc is 57.9 MHz. Therefore, the low-frequency signal can be short-circuited to a higher frequency in the present embodiment, thereby proving that a risk of oscillation is further reduced.

Fifth Embodiment

Figure 15:
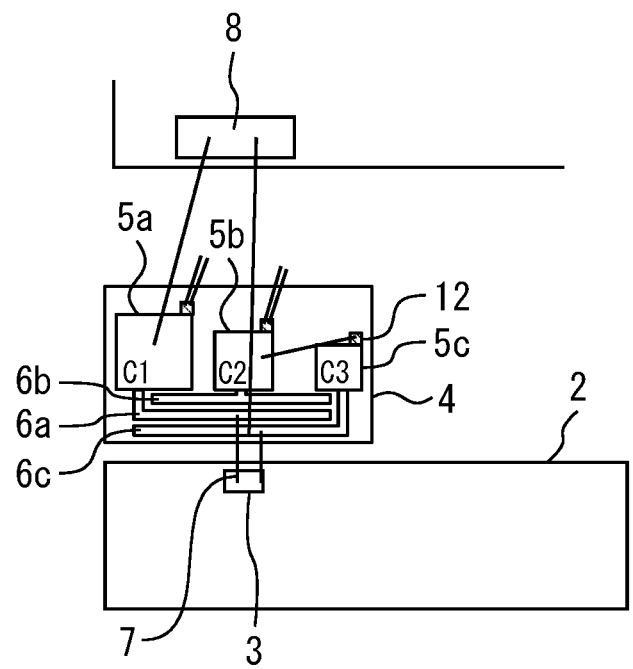
FIG. 15 is a plan view illustrating a semiconductor device according to a fifth embodiment.

FIG. 15 is a plan view illustrating a semiconductor device according to a fifth embodiment. In the present embodiment, MIM capacitors 5a to 5c respectively have different capacitances. Letting C1, C2, and C3 be respectively capacitance values of the MIM capacitors 5a to 5c, the capacitances can be selected in a digital manner between a maximum capacitance C1+C2+C3 and a minimum capacitance C1×C2×C3/(C1×C2+C2×C3+C1×C3) by selecting a method for connecting wires. Since the capacitance values can be selectively determined in the same component, the number of types of and the number of components can be reduced.

In FIG. 15, a DC pad 3 is wire-connected to pads 6a and 6c. An overlying electrode of the MIM capacitor 5b is wire-connected to a ground pad 12 of the MIM capacitor 5c. Respective ground pads 12 of the MIM capacitors 5a and 5b are wire-connected to a GND. An overlying electrode of the MIM capacitor 5a and the pad 6c are wire-connected to a lead connection portion 8.

Figure 16:
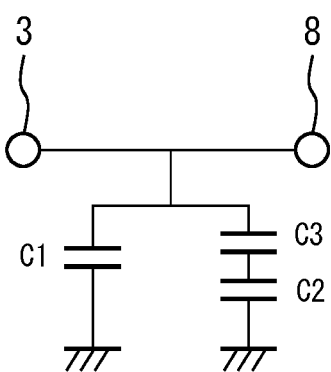
FIG. 16 is a diagram illustrating an equivalent circuit of the semiconductor device according to the fifth embodiment.

FIG. 16 is a diagram illustrating an equivalent circuit of the semiconductor device according to the fifth embodiment. Capacitances C2 and C3 connected in series are connected to the GND in parallel with a capacitance C1. This is a case where a capacitance value is set to C1+C2×C3/(C2+C3). It is assumed that MIM capacitors are used while being connected in series in the present embodiment, and a via hole 13 that connects an underlying electrode 9 referred to in the first embodiment and the GND to each other is not provided.

Figure 17:
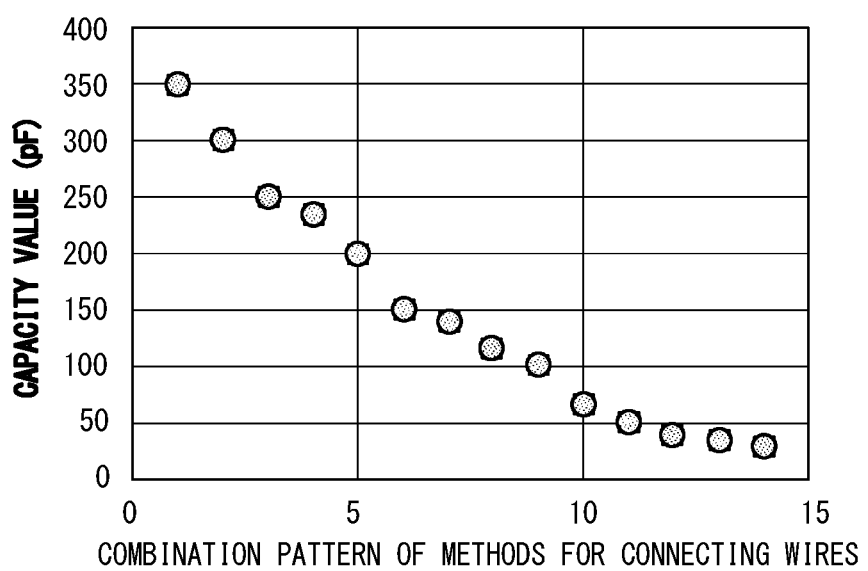
FIG. 17 is a diagram illustrating a capacitance value that can be implemented by a combination of methods for connecting wires.

It is desirable that C1:C2:C3=4:2:1. For example, C1, C2, and C3 are respectively set to 200 pF, 100 pF, and 50 pF. FIG. 17 is a diagram illustrating a capacitance value that can be implemented by a combination of methods for connecting wires. When the method for connecting wires is selected, a capacitance can be selected in a digital manner between a maximum capacitance C1+C2+C3 and a minimum capacitance C1×C2×C3/(C1×C2+C2×C3+C1×C3). The capacitance value in the method for connecting wires illustrated in FIGS. 15 and 16 is approximately 233.33 pF when calculated from C1+C2×C3/(C2+C3). The respective sequences of C1, C2, and C3 to be arranged may be replaced with one another.

If the capacitance values need to be finely adjusted, the capacitance values are set to satisfy C1:C2:C3=3:1.5:1, for example. Even if a spacing among the capacitance values is coarse, the capacitance values are set to satisfy C1:C2:C3=6: 3:1, for example, when a dynamic range is desired to be made large.

The capacitance values may be desired to be changed if MMICs respectively having different performances are used or if an MMIC is used by changing a bias condition. Although different components have been required to be used in a conventional technique, the same component can be used in the present embodiment in which the capacitance values can be selected, thereby making it possible to reduce costs.

Although the preferred embodiments and the like have been described in detail above, the present disclosure is not limited to the above-described embodiments and the like, but the above-described embodiments and the like can be subjected to various modifications and replacements without departing from the scope described in the claims. Aspects of the present disclosure will be collectively described as supplementary notes.

Supplementary Note 1

A semiconductor device includes: an MMIC having a DC pad; a bias substrate; a plurality of MIM capacitors mounted on the bias substrate; a plurality of pads provided on the bias substrate and respectively connected to overlying electrodes of the MIM capacitors; and a wire connecting the DC pad to any one of the plurality of pads, wherein the plurality of pads are arranged between the DC pad and the plurality of MIM capacitors in a planar view, and extend parallel to a row of the plurality of MIM capacitors laterally arranged side by side.

Supplementary Note 2

In the semiconductor device according to Supplementary Note 1, the plurality of MIM capacitors include first to third MIM capacitors arranged in order in a row, the plurality of pads include first to third pads respectively connected to overlying electrodes of the first to third MIM capacitors, and the first to third pads respectively extend at positions opposing the first to third MIM capacitors.

Supplementary Note 3

In the semiconductor device according to Supplementary Note 2, the first pad extends to a position opposing the third MIM capacitor from a position opposing the first MIM capacitor, the third pad extends to a position opposing the first MIM capacitor from a position opposing the third MIM capacitor, and the second pad extends to a position opposing the first MIM capacitor and a position opposing the third MIM capacitor after branching from a position opposing the second MIM capacitor.

Supplementary Note 4

In the semiconductor device according to Supplementary Note 2 or 3, the plurality of MIM capacitors further include a fourth MIM capacitor arranged in a row with the first to third MIM capacitors, the plurality of pads further include a fourth pad connected to an overlying electrode of the fourth MIM capacitor, and the fourth pad extends at a position opposing the first to fourth MIM capacitors.

Supplementary Note 5

In the semiconductor device according to Supplementary Note 2 or 3, the plurality of MIM capacitors further include fourth to sixth MIM capacitors arranged parallel to the row of the first to third MIM capacitors, the plurality of pads further include fourth to sixth pads respectively connected to overlying electrodes of the fourth to sixth MIM capacitors and arranged between the DC pad and the first to third MIM capacitors in a planar view, and the fourth to sixth pads respectively extend at positions opposing the first to third MIM capacitors.

Supplementary Note 6

In the semiconductor device according to any one of Supplementary Notes 1 to 5, the plurality of pads include two pads adjacent to each other and having an uneven shape, and a projection of one of the two pads is arranged to be fitted into a recess of the other pad.

Supplementary Note 7

In the semiconductor device according to any one of Supplementary Notes 1 to 6, the plurality of MIM capacitors have different capacitances.

Supplementary Note 8

In the semiconductor device according to Supplementary Note 2 or 3, $C1$, $C2$, and $C3$ are respectively capacitance values of the first to third MIM capacitors, and $C1:C2:C3=4:2:1$.

Supplementary Note 9

The semiconductor device according to any one of Supplementary Notes 1 to 8, further includes a plurality of ground pads provided on the bias substrate and respectively connected to underlying electrodes of the plurality of MIM capacitors.

Supplementary Note 10

The semiconductor device according to any one of Supplementary Notes 1 to 8, further includes a plurality of via holes penetrating the bias substrate and respectively connected to underlying electrodes of the plurality of MIM capacitors.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2022-070701, filed on Apr. 22, 2022 including specification, claims, drawings and summary, on which the convention priority of the present application is based, is incorporated herein by reference in its entirety.

The invention claimed is:
1. A semiconductor device comprising:
an MMIC having a DC pad;
a bias substrate;
a plurality of MIM capacitors mounted on the bias substrate;
a plurality of pads provided on the bias substrate and respectively connected to overlying electrodes of the MIM capacitors; and
a wire connecting the DC pad to any one of the plurality of pads, wherein the plurality of pads are arranged between the DC pad and the plurality of MIM capacitors in a planar view, and extend parallel to a row of the plurality of MIM capacitors laterally arranged side by side, each of the plurality of pads being entirely spaced from each other.

2. The semiconductor device according to claim 1, wherein the plurality of MIM capacitors include first to third MIM capacitors arranged in order in a row, the plurality of pads include first to third pads respectively connected to overlying electrodes of the first to third MIM capacitors, the first pad opposes the first MIM capacitor, the second pad opposes the second MIM capacitor, and the third pad opposes the third MIM capacitor.

3. The semiconductor device according to claim 2, wherein the first pad extends to a position opposing the third MIM capacitor from a position opposing the first MIM capacitor, the third pad extends to a position opposing the first MIM capacitor from a position opposing the third MIM capacitor, and the second pad extends to a position opposing the first MIM capacitor and a position opposing the third MIM capacitor after branching from a position opposing the second MIM capacitor.

4. The semiconductor device according to claim 2, wherein the plurality of MIM capacitors further include a fourth MIM capacitor arranged in a row with the first to third MIM capacitors, the plurality of pads further include a fourth pad connected to an overlying electrode of the fourth MIM capacitor, and the fourth pad extends at a position opposing the first to fourth MIM capacitors.

5. The semiconductor device according to claim 3, wherein the plurality of MIM capacitors further include a fourth MIM capacitor arranged in a row with the first to third MIM capacitors, the plurality of pads further include a fourth pad connected to an overlying electrode of the fourth MIM capacitor, and the fourth pad extends at a position opposing the first to fourth MIM capacitors.

6. The semiconductor device according to claim 2, wherein the plurality of MIM capacitors further include fourth to sixth MIM capacitors arranged parallel to the row of the first to third MIM capacitors, the plurality of pads further include fourth to sixth pads respectively connected to overlying electrodes of the fourth to sixth MIM capacitors and arranged between the DC pad and the first to third MIM capacitors in a planar view, and the fourth to sixth pads respectively extend at positions opposing the first to third MIM capacitors.

7. The semiconductor device according to claim 3, wherein the plurality of MIM capacitors further include fourth to sixth MIM capacitors arranged parallel to the row of the first to third MIM capacitors, the plurality of pads further include fourth to sixth pads respectively connected to overlying electrodes of the fourth to sixth MIM capacitors and arranged between the DC pad and the first to third MIM capacitors in a planar view, and the fourth to sixth pads respectively extend at positions opposing the first to third MIM capacitors.

8. The semiconductor device according to claim 1, wherein the plurality of pads include two pads adjacent to each other and having an uneven shape, and a projection of one of the two pads is arranged to be fitted into a recess of the other pad.

9. The semiconductor device according to claim 2, wherein the plurality of pads include two pads adjacent to each other and having an uneven shape, and a projection of one of the two pads is arranged to be fitted into a recess of the other pad.

10. The semiconductor device according to claim 3, wherein the plurality of pads include two pads adjacent to each other and having an uneven shape, and a projection of one of the two pads is arranged to be fitted into a recess of the other pad.

11. The semiconductor device according to claim 1, wherein the plurality of MIM capacitors have different capacitances.

12. The semiconductor device according to claim 2, wherein the plurality of MIM capacitors have different capacitances.

13. The semiconductor device according to claim 3, wherein the plurality of MIM capacitors have different capacitances.

14. The semiconductor device according to claim 2, wherein C1, C2, and C3 are respectively capacitance values of the first to third MIM capacitors, and C1:C2:C3=4:2:1.

15. The semiconductor device according to claim 3, wherein C1, C2, and C3 are respectively capacitance values of the first to third MIM capacitors, and C1:C2:C3=4:2:1.

16. The semiconductor device according to claim 1, further comprising a plurality of ground pads provided on the bias substrate and respectively connected to underlying electrodes of the plurality of MIM capacitors.

17. The semiconductor device according to claim 2, further comprising a plurality of ground pads provided on the bias substrate and respectively connected to underlying electrodes of the plurality of MIM capacitors.

18. The semiconductor device according to claim 3, further comprising a plurality of ground pads provided on the bias substrate and respectively connected to underlying electrodes of the plurality of MIM capacitors.

19. The semiconductor device according to claim 1, further comprising a plurality of via holes penetrating the bias substrate and respectively connected to underlying electrodes of the plurality of MIM capacitors.

20. The semiconductor device according to claim 2, further comprising a plurality of via holes penetrating the bias substrate and respectively connected to underlying electrodes of the plurality of MIM capacitors.

* * * * *